United States Patent
Cross

(10) Patent No.: US 9,647,159 B2
(45) Date of Patent: May 9, 2017

(54) PHOTOVOLTAIC PANEL

(75) Inventor: Bruce Cross, Bristol (GB)

(73) Assignee: Solar Slate Limited, Kings Langley (GB)

(*) Notice: Subject to any disclaimer, the term of this patent is extended or adjusted under 35 U.S.C. 154(b) by 1648 days.

(21) Appl. No.: 12/811,193

(22) PCT Filed: Jan. 5, 2009

(86) PCT No.: PCT/GB2009/000013
§ 371 (c)(1),
(2), (4) Date: Nov. 23, 2010

(87) PCT Pub. No.: WO2009/087365
PCT Pub. Date: Jul. 16, 2009

(65) Prior Publication Data
US 2011/0056535 A1 Mar. 10, 2011

(30) Foreign Application Priority Data
Jan. 4, 2008 (GB) .................................. 0800160.4

(51) Int. Cl.
*H01L 31/042* (2014.01)
*H01L 31/048* (2014.01)
*H01L 31/02* (2006.01)
*H02S 20/25* (2014.01)

(52) U.S. Cl.
CPC ...... *H01L 31/048* (2013.01); *H01L 31/02008* (2013.01); *H02S 20/25* (2014.12); *Y02B 10/12* (2013.01); *Y02E 10/50* (2013.01); *Y10T 29/49826* (2015.01); *Y10T 29/5313* (2015.01)

(58) Field of Classification Search
None
See application file for complete search history.

(56) References Cited

U.S. PATENT DOCUMENTS

| 4,322,261 | A |   | 3/1982  | Dubois |
|-----------|---|---|---------|-----------------|
| 4,880,677 | A | * | 11/1989 | Hecq et al. ............ 428/38 |
| 5,005,557 | A |   | 4/1991  | Bächli |
| 5,009,218 | A |   | 4/1991  | Bächli |
| 5,289,999 | A |   | 3/1994  | Naujeck et al. |
| 5,768,831 | A |   | 6/1998  | Melchior |
| 5,986,203 | A | * | 11/1999 | Hanoka et al. ........ 136/251 |

(Continued)

FOREIGN PATENT DOCUMENTS

| DE | 40 14 200 A1 | 11/1990 |
| EP | 1 058 320 A2 | 12/2000 |

(Continued)

OTHER PUBLICATIONS

English Machine Translation of Tsujii (JP 2006-165434), accessed Feb. 1, 2013.*

(Continued)

*Primary Examiner* — Shannon Gardner
(74) *Attorney, Agent, or Firm* — Finnegan, Henderson, Farabow, Garrett & Dunner, L.L.P.

(57) ABSTRACT

A photovoltaic panel (10) comprising a back plate (12), a front sheet (20) and a photovoltaic cell (30) disposed between the back plate (12) and the front sheet (20), wherein the photovoltaic panel (10) comprises a protective element (22, 24) which extends along an edge of the front sheet (20) without extending beyond an uppermost surface of the front sheet (20).

13 Claims, 5 Drawing Sheets

(56) References Cited

U.S. PATENT DOCUMENTS

| | | | | |
|---|---|---|---|---|
| 6,069,313 | A | * | 5/2000 | Kay .............................. 136/249 |
| 6,337,436 | B1 | | 1/2002 | Ganz |
| 6,384,318 | B1 | | 5/2002 | Nomura |
| 6,528,718 | B2 | * | 3/2003 | Yoda et al. .................... 136/251 |
| 2006/0039135 | A1 | * | 2/2006 | Jones et al. ................... 362/145 |
| 2008/0041436 | A1 | * | 2/2008 | Lau et al. ..................... 136/244 |

FOREIGN PATENT DOCUMENTS

| | | | |
|---|---|---|---|
| JP | 07-131045 | | 5/1995 |
| JP | 08-97458 | | 4/1996 |
| JP | 2003-161003 | | 6/2003 |
| JP | 2006-165434 | | 6/2006 |
| JP | 2006165434 | A * | 6/2006 |
| WO | WO2008/136872 | A2 | 11/2008 |

OTHER PUBLICATIONS

Rudolf Hezel, Novel Back Contact Silicon Solar Cells Designed for Very High Efficiencies and Low-Cost Mass Production, 2002, IEEE, pp. 114-117.*

International Search Report from the European Patent Office for International Application No. PCT/GB2009/000013, mailing date Aug. 6, 2010.

English-language search report from the United Kingdom Patent Office in the priority application No. GB0800160.4, search dated Apr. 28, 2008.

Izumi; "Solar-Battery Module—Has Transparent Protection Board Arranged on Light-Incidence Side of Collector Electrode and Supports Each Filament Structure Placed on Focal Zone of Ditch", English Abstract of JP8097458, (WPI Accession No. 1996-244755), (1996).

Examination Report dated Jun. 7, 2011 from the UK Intellectual Property Office in Application No. GB0800160.4

Examination Report dated Aug. 18, 2011 from the UK Intellectual Property Office in Application No. GB0800160.4.

Bouverat, P.R., "Electra-Slate Proposal to Develop an Amorphous PV Roofslate," ETSU S/P2/00327/REP, Intersolar Group Limited Feasibility Study, 2000, (35 pages).

* cited by examiner

PHOTOVOLTAIC PANEL

CROSS REFERENCE TO RELATED APPLICATIONS

This application is a national phase application based on PCT/GB2009/000013, filed Jan. 5, 2009, which claims the priority of United Kingdom Application No. GB 0800160.4, filed Jan. 4, 2008.

The present invention relates to a photovoltaic panel, to a building element comprising a photovoltaic panel, to a method of installing a photovoltaic panel on a structure, to an apparatus for connecting a photovoltaic panel to an electrical network and to a kit comprising a photovoltaic panel and a connecting apparatus.

As reserves of natural resources such as oil, gas and coal which have hitherto been used in the generation of electricity become exhausted and concern grows over the environmental impact of using such resources to generate electricity, alternative energy sources, sometimes referred to as "renewable energy sources" have been sought and developed.

Once such source is solar energy (i.e. radiant energy from the sun), which can be converted into electricity using photovoltaic cells. A single photovoltaic cell can only produce a small amount of electricity (typically around 0.5 volts), and thus a plurality of such cells are usually connected together in series to form a panel which can generate a usable amount of electricity. Such a panel typically comprises a back plate with a layer of impact-absorbing sealing material such as polyester or polyvinyl fluoride (such as that sold under the brand name Tedlar®) on which the plurality of photovoltaic cells is mounted. A substantially transparent or translucent layer (or layers) of ethylene vinyl acetate (EVA) or similar material covers the photovoltaic cells, and a layer of toughened glass overlies this layer. The layers are hermetically sealed by vacuum temperature lamination and enclosed in a housing or frame which is typically of a metal such as aluminium or steel to seal the panel, with a termination box providing electrical connections to the photovoltaic cells.

A disadvantage of these known photovoltaic panels is that the edges of the housing are raised in relation to the upper surface of the toughened glass layer, and when installed these raised edges tend to trap water, dirt, leaves and the like, which can lead to a deterioration in the performance, or even failure, of the panel. Moreover, as the housing surrounding the layers extends outwardly of the sides and upper layer, the panel is very noticeable, and thus unsuitable for aesthetically-sensitive applications.

The applicant has developed alternative panels in which there is no housing or frame, but has found that these tend to be fragile, as the edges and corners of the toughened glass layer, which are particularly vulnerable, are exposed.

According to a first aspect of the invention, there is provided a photovoltaic panel comprising a back plate, a front sheet and a photovoltaic cell disposed between the back plate and the front sheet, wherein the photovoltaic panel comprises a protective element which extends along an edge of the front sheet without extending beyond an uppermost surface of the front sheet.

The protective element serves to protect the edge of the front sheet, and obviates the need for a housing or frame surrounding the panel. Such a construction is more robust than known unframed photovoltaic panels, thus reducing the likelihood that a photovoltaic panel according to the present invention will be damaged during normal handling, installation and use. Moreover, the absence of a surrounding frame or housing makes a photovoltaic panel according to the invention less noticeable than a known framed photovoltaic panel, which allows it to be installed in aesthetically-sensitive locations such as on the roofs of listed buildings.

The protective element may comprise a lip which extends from the back plate along the edge of the front sheet.

The photovoltaic panel may have a further protective element comprising a further lip which extends from the back plate along another edge of the front sheet without extending beyond an uppermost surface of the front sheet.

Alternatively, the protective element may comprise an element having an arm which extends along an edge of the front plate without extending beyond an upper surface of the front plate when a connecting portion of the protective element is inserted into the photovoltaic panel.

For example, the protective element may comprise an element which is generally T- or L-shaped in cross-section.

The photovoltaic cell may comprise a back-contact photovoltaic cell.

Alternatively, the photovoltaic cell may comprise a bi-facial contact photovoltaic cell.

A plurality of photovoltaic cells may be disposed between the back plate and the front sheet.

The back plate is preferably of an electrically insulating material.

For example, the back plate may be of anodised aluminium.

Alternatively, the back plate may be of a material having an electrically insulating surface.

Alternatively, the back plate may be of a plastics material or a plastics-coated material.

The front plate is preferably of a substantially transparent or translucent material.

For example, the front plate may be of toughened glass.

The front plate may be of shot-blasted toughened glass.

The photovoltaic panel may further comprise an electrical connector for connecting the panel to an electrical network or to another panel.

The electrical connector is preferably disposed on an underside of the back plate.

Advantageously, the electrical connector comprises a snap-fit connector.

According to a second aspect of the invention, there is provided a building element comprising a photovoltaic panel according to the first aspect of the invention.

According to a third aspect of the invention, there is provided a method of installing a photovoltaic panel on a structure, wherein the photovoltaic panel comprises a back plate, a front sheet, a photovoltaic cell disposed between the back plate and the front sheet and an electrical connector for connecting the photovoltaic panel to an electrical network, the photovoltaic panel comprising a protective element which extends along an edge of the front plate without extending beyond an uppermost surface of the front sheet, the method comprising connecting the electrical connector to a complementary connector on the structure, positioning the panel and securing it in position.

The panel may be secured using hooks.

According to a fourth aspect of the invention, there is provided apparatus for connecting a photovoltaic panel according to the first aspect of the invention to an electrical network, the apparatus comprising a connecting element having a connector configured for engagement with a complementary connector of the photovoltaic panel and a cable for connecting the apparatus to the electrical network.

The connector of the connecting element may comprise a snap-fit connector.

The connecting element may further comprise a bypass diode.

According to a fifth aspect of the invention, there is provided a kit comprising a photovoltaic panel according to the first aspect of the invention and an apparatus according to the fourth aspect of the invention.

Embodiments of the invention will now be described, strictly by way of example only, with reference to the accompanying drawings, of which FIG. 1 is a schematic cross-sectional view showing the construction of a photovoltaic panel according to the present invention;

Figure 1:
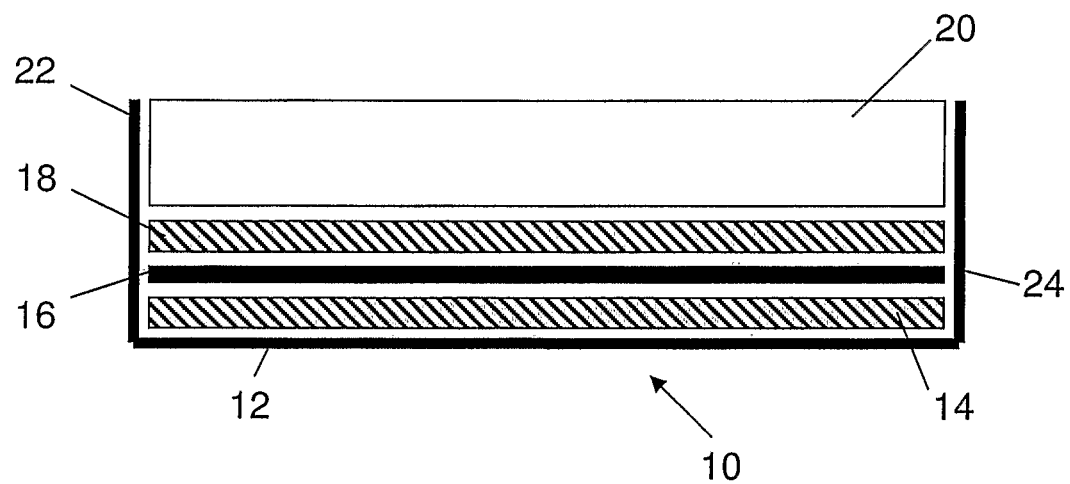

Referring first to FIG. 1, a photovoltaic panel is shown generally at 10, in a schematic cross-section taken from one end. In this example, the photovoltaic panel 10 comprises a substantially rectangular back plate 12 having two opposed longer sides and two opposed shorter sides. Disposed on the back plate 12 is a first sealing layer 14 of EVA or similar material. The back plate 12 is of anodised aluminium, which is advantageous as it is lightweight but strong and durable, and is electrically insulating. However, other materials, such as steel or plastics materials are equally suitable, although electrically insulating materials, or materials having electrically insulating surfaces (such as plastics-coated materials) are preferred.

The first sealing layer 14 serves two purposes, firstly as a seal to help to prevent the ingress of moisture into the photovoltaic panel 10, and secondly to act as a shock absorber to reduce the risk of damage to the photovoltaic panel 10 in the event of an impact, which may arise if the photovoltaic panel 10 is dropped, for example.

A layer 16 of photovoltaic cells is mounted on or embedded in the first sealing layer 14, and these photovoltaic cells convert solar energy into electricity. Preferably the photovoltaic cells are back-contact cells, meaning that all the electrical connections to the photovoltaic cells are made on the underside (i.e. the side that is not exposed to sunlight) of the cells. Back-contact photovoltaic cells are preferred for use in the photovoltaic panel 10 as they do not have any connectors, tracks or other components on their upper side, and thus have a greater surface area for capturing sunlight, which leads to greater efficiency (typically around 21 percent) than front-contact cells. Moreover, as there are no connectors, tracks or other components on the upper side of such cells, they are less recognisable as photovoltaic cells, and can be more easily disguised or camouflaged, so that the photovoltaic panel 10 is more discreet and less noticeable, and is thus suitable for installation in aesthetically-sensitive locations. Nevertheless, bi-facial contact photovoltaic cells (i.e. photovoltaic cells having contacts, connections or the like on the sides that are exposed to sunlight, as well as their undersides) may be used, if desired, or a combination of back-contact and bi-facial contact photovoltaic cells may be used.

A second sealing layer 18 of EVA or a similar material seals the layer 16 of photovoltaic cells and provides some shock protection. This layer 18 is substantially transparent or translucent, to permit light to pass through it and reach the photovoltaic cells.

A front sheet 20 of toughened glass or a similar substantially transparent or translucent material, which is generally rectangular and corresponds generally to the shape and dimensions of the back plate 12, is disposed on top of the second sealing layer 18. In this example, the front sheet 18 is of shot-blasted toughened glass, as this gives the photovoltaic panel 10 an appearance similar to that of natural slate, which is advantageous in that it enables the photovoltaic panel 10 to "blend in" if installed on a slate roof, for example. Other materials or finishes can be used (provided of course that they are substantially transparent or translucent, to allow light to reach the layer 16 of photovoltaic cells) to allow the photovoltaic panel 10 to blend in to its surroundings when installed.

In this embodiment, the back plate 12 of the photovoltaic panel 10 is provided, at its longer sides, with peripheral lips 22, 24 which extend upwardly of the back plate along the longer edges (which, when the photovoltaic panel 10 is installed on a roof, are oriented in a direction substantially parallel to the slope of the roof) of the front sheet 20, thus enclosing the longer edges of the first sealing layer 14, the layer 16 of photovoltaic cells, the second sealing layer 18 and the front sheet 20. The peripheral lips 22, 24 terminate at a position which is substantially flush with an upper surface of the front sheet 20, thus enclosing the longer edges of the front sheet 20 without extending beyond its upper surface.

The peripheral lips 22, 24 serve as protective elements to protect the vulnerable longer edges and corners of the front plate 20 of the photovoltaic panel 10, making the photovoltaic panel 10 more robust than known unframed panels. As there is no protruding housing, the problem associated with known framed panels of water and debris being trapped is eliminated. Moreover, as the photovoltaic panel 10 is an essentially flat unit, it can easily be installed in a variety of locations, and is unobtrusive when installed, for example with slates on a roof of a building.

Figure 2:
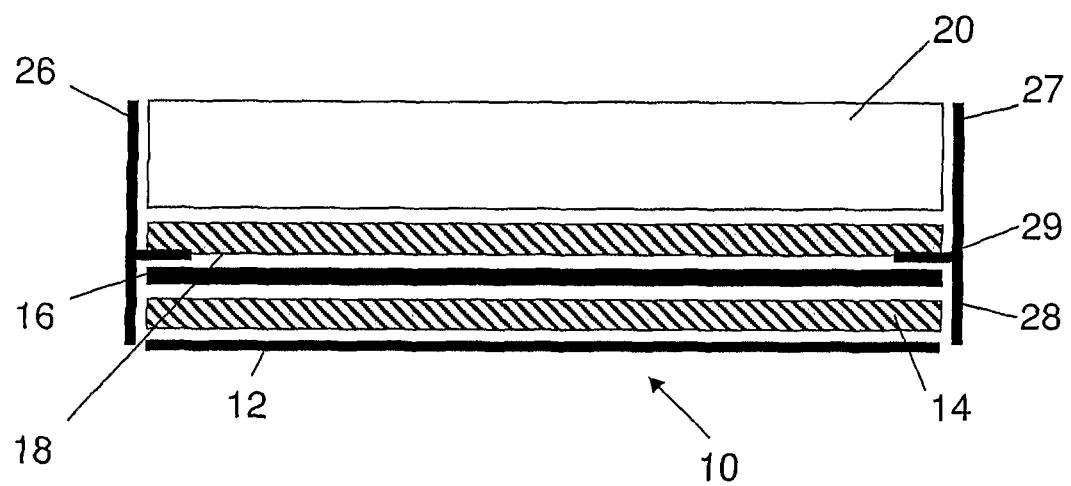
FIG. 2 is a schematic cross-sectional view showing the construction of an alternative photovoltaic panel according to the present invention.

FIG. 2 shows an alternative embodiment of a photovoltaic panel 10. Features which are common to this embodiment and the embodiment shown in FIG. 1 are designated by like reference numerals. In this embodiment, the back plate 12 is not provided with lips, but instead protective elements 26, 28 are provided, in this case in the form of elements which are generally T-shaped in cross-section, having arms 27 and connecting portions 29. When the connecting portions 29 are inserted or embedded in the second sealing layer 18, the arms 27 of the protective elements 26, 28 extend upwardly to enclose the longer edges of the front sheet 20, without extending beyond an uppermost surface of the front sheet 20, and downwardly to enclose the longer edges of the first sealing layer 14 and the layer 16 of photovoltaic cells.

Figure 3:
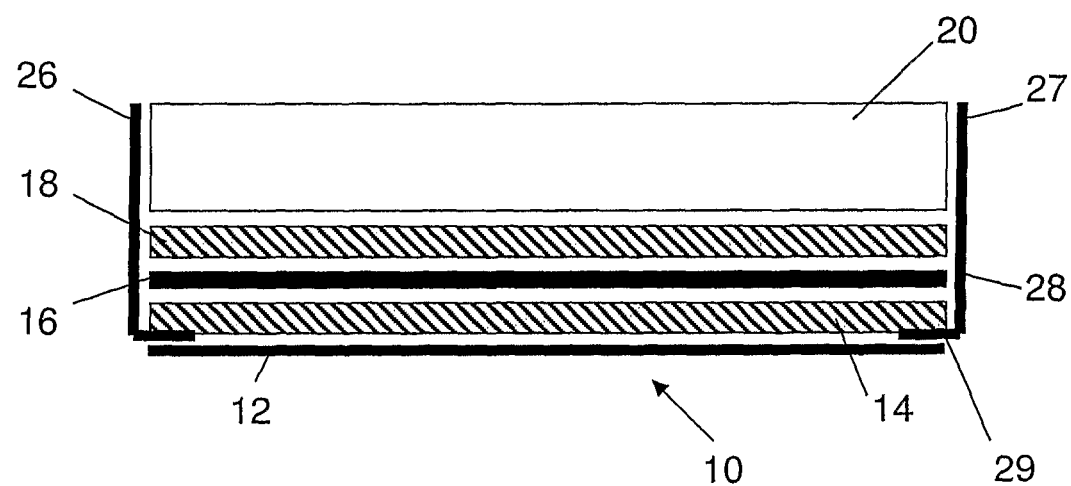
FIG. 3 is a schematic cross-sectional view showing the construction of an alternative photovoltaic panel according to the present invention.

FIG. 3 shows a further alternative embodiment of a photovoltaic panel 10. Again, features which are common to this embodiment and the embodiments shown in FIGS. 1 and 2 are designated by like reference numerals. In this embodiment, the protective elements 26, 28 are generally L-shaped in cross-section, having arms 27 and connecting portions 29. With the connecting portions 29 inserted or embedded in the first sealing layer 14, the arms 27 of the protective elements 26, 28 extend upwardly to enclose the longer edges of the layer 16 of photovoltaic cells, the second sealing layer 18 and the front sheet 20, without extending beyond an uppermost surface of the front sheet 20.

The protective elements 26, 28 of the embodiments shown in FIGS. 2 and 3 serve to protect the vulnerable edges and corners of the front sheet 20, and may be of any material suitable for this purpose. For example, they may be provided as aluminium extrusions. Alternatively, the protective elements 26, 28 may be formed of excess material which leaks out of the first and/or second sealing layers 14, 16 during manufacture of the photovoltaic panel 10.

The protective elements 26, 28 may take any form suitable for the purpose of protecting the edges of the front sheet 20. For example, the protective elements may be provided with two connecting portions 29, one of which may be inserted or embedded in the first sealing layer 14, with the other being inserted or embedded in the second sealing layer 16, to provide additional stability to the protective elements 26, 28.

It will be appreciated that the connecting portions 29 of the protective elements 26, 28 need not be inserted in the first or second sealing layers 14, 18, but may be inserted between any two layers of the photovoltaic cell 10, although the first and second sealing layers 14, 18 are particularly suitable, as they are adhesive when applied and subsequently set firm, thus helping to hold the protective elements 26, 28 in place.

Although the photovoltaic panels shown in FIGS. 1 to 3 are shown as being rectangular and having protective elements provided at their longer sides, it will be appreciated that a photovoltaic panel may take any shape, but the protective elements should be provided such that, when the photovoltaic panel is installed on a roof, the protective elements cannot trap water and debris sliding down the panel. Typically therefore, the protective elements will be provided on one or more sides of the panel which, when the panel is installed on a roof, are oriented in a direction substantially parallel to the slope of the roof.

Figure 4:
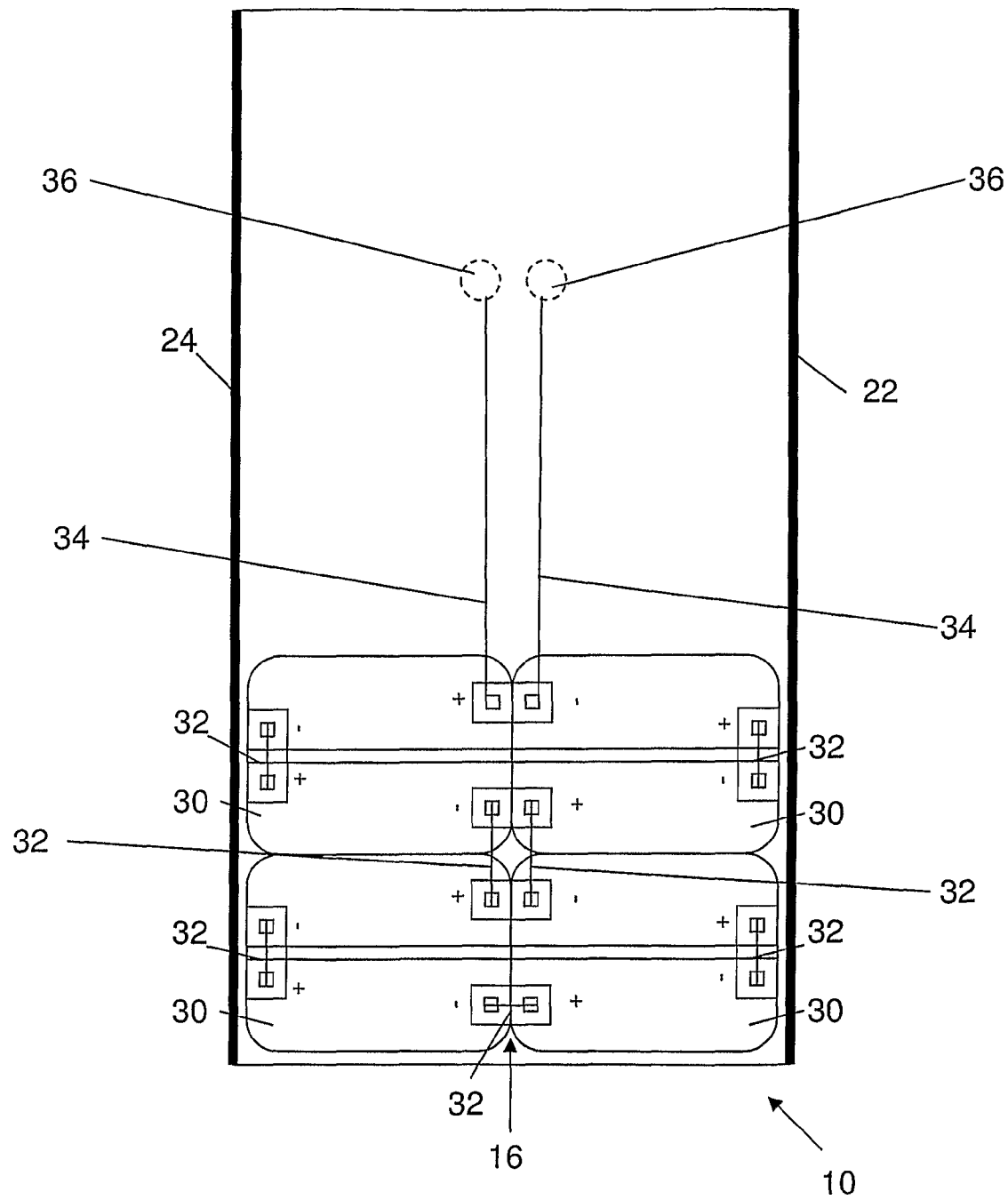
FIG. 4 is a schematic view from above the photovoltaic panel shown in FIG. 1.

FIG. 4 is a schematic view from above the photovoltaic panel 10, from which it can be seen that the layer 16 of photovoltaic cells comprises a plurality (typically four or more, depending upon the required output voltage of the photovoltaic panel 10) of back-contact photovoltaic cells or cell fractions 30 connected together in series by connections 32. Terminal connections 34 connect the photovoltaic cells 30 to positive and negative connectors 36, which are positioned on an underside of the back plate 12 for connecting the photovoltaic panel 10 to an electrical network, and/or to other photovoltaic panels 10. The terminal connections 34 in the example shown in FIG. 4 extend in generally straight lines from the photovoltaic cells 30, through a central portion of the photovoltaic panel 10, to the connectors 36. However, in alternative embodiments the terminal connections 34 may take different paths, for example extending around the edges of the photovoltaic cells 30, to connect the photovoltaic cells 30 to the connectors 36.

In this example the connectors 36 are generally circular snap-fit connectors which clip into or around a corresponding connector of the electrical network, although it will be appreciated that other types of connector are suitable for this purpose. However, snap-fit connectors 36 of the type described above are preferred, as they facilitate installation of the photovoltaic panel 10, as a secure connection can be confirmed by the sound or feel of a "click" as the connector 36 engages with the corresponding connector of the electrical network.

Figure 5:
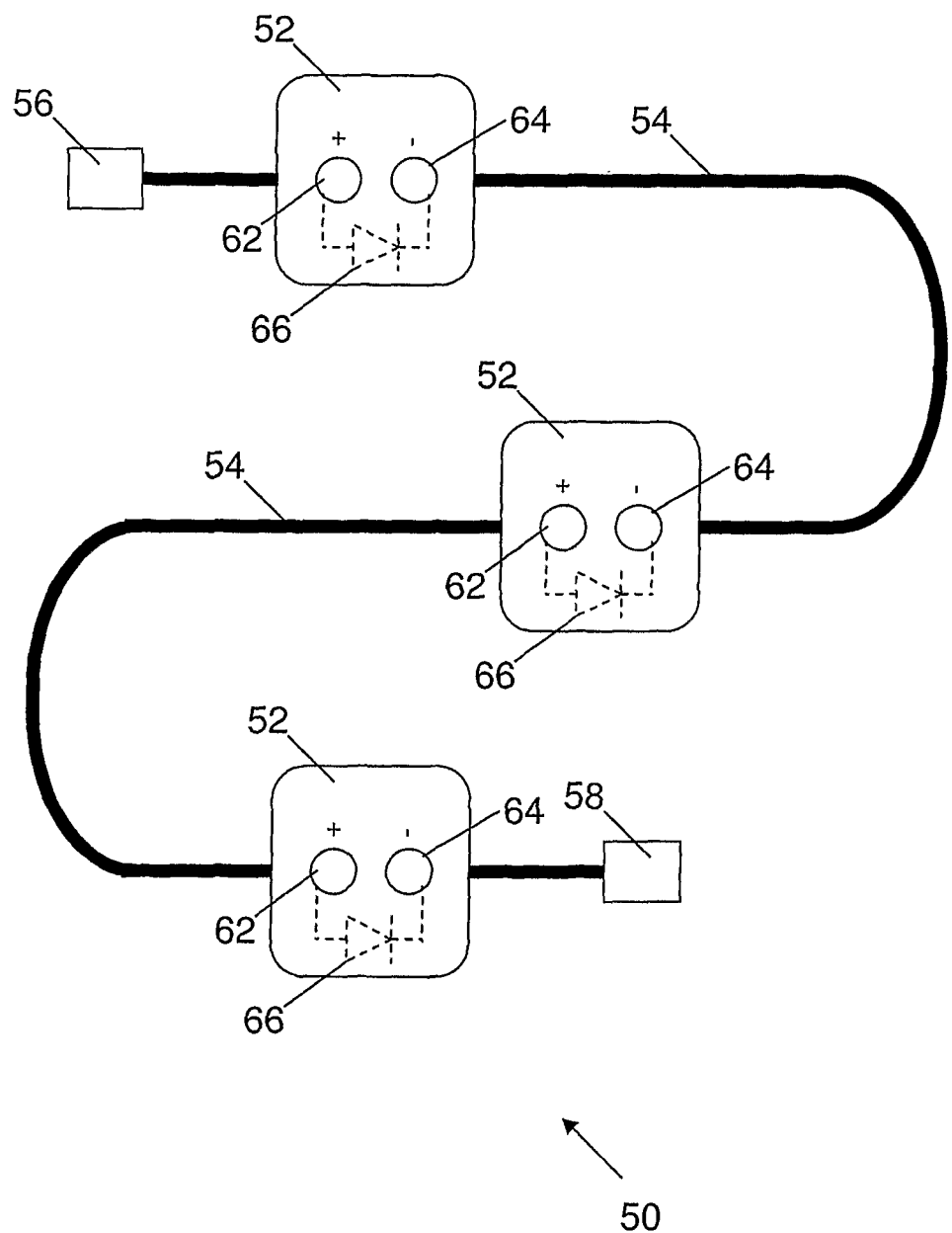
FIG. 5 is a schematic representation of a connecting apparatus for connecting one or more photovoltaic panels to another photovoltaic panel and/or to an electrical network.

FIG. 5 is a schematic illustration of an apparatus (known as a "loom") for connecting one or more photovoltaic panels 10 to another photovoltaic panel 10 and/or to an electrical network. The loom is shown generally at 50, and comprises a plurality of connector elements 52, connected in series by cables 54. A first end of the loom 50 is terminated by a connector 56, whilst a second end of the loom 50 is terminated by another connector 58.

Each of the plurality of connector elements 52 is provided with positive and negative connectors 62, 64, which are configured to engage with the connectors 36 which are provided on the underside of the back plate 12 of the photovoltaic panel 10. A bypass diode 66 is connected across each pair of connectors 62, 64, to ensure that in the event of the failure or disconnection of a photovoltaic panel 10 to which a connector element 52 is connected, a path still exists for current flow. Thus, in the event of such a failure or disconnection, only the output of a single panel 10 is lost.

The connectors 56, 58 are configured to connect to complementary connectors of an electrical network to be supplied by the one or more photovoltaic cells, and may be complementary to each other such that a plurality of looms 50 can be connected in series.

Assembly of the photovoltaic panel 10 is achieved substantially as described above in relation to known framed panels, although it will be appreciated that there is no step of enclosing the panel 10 in a frame or housing. The connectors 36 are preferably attached to the underside of the panel 10 prior to lamination of the panel 10.

The photovoltaic panel 10 is suitable for a variety of applications, for example as a building element, and in particular as a roofing slate for a building or other structure. The shot-blasted finish of the front sheet 20 gives the photovoltaic panel 10 an appearance similar to that of natural slate, such that the photovoltaic panel 10 blends into its surroundings when installed on a slate roof. Moreover, the photovoltaic panel can be installed using a generally conventional method of installing roofing slates, which is known to roofers and thus requires little or no additional training.

To install one or more photovoltaic panels 10 as roofing slates, it is first necessary to install the wiring to connect the photovoltaic panel(s) 10 to an electrical network and/or to each other. This wiring is typically provided in the form of one or more looms 50. One or more cables carrying one or more connectors which are complementary to the connectors 36 of the photovoltaic panel 10 are laid across the roof, with the connector(s) being positioned close to the position in which the photovoltaic panel(s) (10) are to be installed. The cables may be clipped onto battens of the roof to secure them in position.

The connectors 36 of a photovoltaic panel 10 are brought into engagement with the complementary connectors carried by the cables. The snap-fit engagement of the connectors 36 with the complementary connectors carried by the cables allows confirmation that a secure connection has been made, as a click can be heard and/or felt by the installer. Once a secure connection has been made, the photovoltaic panel 10 can be slid into a desired position and secured by a slate hook which engages with a lowermost shorter edge of the photovoltaic panel 10 to retain the photovoltaic panel 10 in position.

To assist in the correct location and connection of the connectors 36 of the photovoltaic panels 10 with complementary connectors 62, 64 of the loom(s) 50, a test instrument may be connected to the connectors 56, 58 of the loom prior to installation of the photovoltaic panels 10, such that when a photovoltaic panel is correctly connected to a connector element 52 of the loom 50, an audible indicator such as a buzzer or sounder or a visible indicator such as a light can be activated. This assists in ensuring that the photovoltaic panels 10 are correctly connected to the connector elements 52 of the loom 50.

It will be understood that when the photovoltaic panel 10 is installed on a sloping roof in this manner, its construction makes it unlikely that the operation of the photovoltaic panel 10 will be impeded by trapped water, leaves or other debris. As the photovoltaic panel is essentially flat, there are no obstacles on which water and debris can become trapped. When the photovoltaic panel 10 is installed, the peripheral lips 22, 24 of the back plate are oriented in a "downhill" direction, and thus cannot present an obstacle to water or debris sliding down the photovoltaic panel.

A similar method can be used for installing a photovoltaic panel 10 in other applications, for example as a wall tile, although adhesive or other methods may be preferred to hooks for securing the photovoltaic panel to the wall.

It will be appreciated that the number and configuration of photovoltaic cells 30 in the photovoltaic panel 10 will depend upon the application for which the photovoltaic panel 10 is intended. For example, if the photovoltaic panel 10 is intended for use as a roofing slate, only a portion of the layer 16 may be provided with photovoltaic cells 30, as when installed, a portion of upper surface of the photovoltaic panel 10 will be obscured by overlapping slates or photovoltaic panels 10 of an adjacent course of slates. Conversely, if the photovoltaic panel 10 is intended for use as a wall tile, the whole, or at least the majority, of the layer 16 may be provided with photovoltaic cells 30, to maximise the amount of electricity generated by the photovoltaic panel 10.

The invention claimed is:

1. A photovoltaic panel, comprising:
   a back plate,
   a front sheet of substantially transparent or translucent material;
   a photovoltaic cell disposed between the back plate and the front sheet, wherein the photovoltaic panel is generally rectangular, having a pair of opposed longer edges and a pair of opposed shorter edges; and
   protective elements in the form of lips which extend only from the longer edges of the back plate along only the longer edges of the front sheet without extending beyond an uppermost surface of the front sheet.

2. A photovoltaic panel according to claim 1 wherein the photovoltaic cell comprises a back-contact photovoltaic cell.

3. A photovoltaic panel according to claim 1 wherein the photovoltaic cell comprises a bi-facial contact photovoltaic cell.

4. A photovoltaic panel according to claim 1 wherein a plurality of photovoltaic cells are disposed between the back plate and the front sheet.

5. A photovoltaic panel according to claim 1 wherein the back plate is of an electrically insulating material.

6. A photovoltaic panel according to claim 5 wherein the back plate is of anodized aluminum.

7. A photovoltaic panel according to claim 1 wherein the back plate is of a material having an electrically insulating surface.

8. A photovoltaic panel according to claim 5 wherein the back plate is of a plastics material or a plastics-coated material.

9. A photovoltaic panel according to claim 1 wherein the front sheet is made of toughened glass.

10. A photovoltaic panel according to claim 9 wherein the front sheet is of shot-blasted toughened glass.

11. A photovoltaic panel according to claim 1 further comprising an electrical connector for connecting the panel to an electrical network.

12. A photovoltaic panel according to claim 11 wherein the electrical connector is disposed on an underside of the back plate.

13. A photovoltaic panel according to claim 11 wherein the electrical connector comprises a snap-fit connector.

* * * * *